(12) United States Patent
Williams et al.

(10) Patent No.: US 11,913,111 B2
(45) Date of Patent: Feb. 27, 2024

(54) POLYCRYSTALLINE SYNTHETIC DIAMOND MATERIAL

(71) Applicant: ELEMENT SIX TECHNOLOGIES LIMITED, Didcot (GB)

(72) Inventors: Gruffudd Trefor Williams, Didcot (GB); Richard Stuart Balmer, Didcot (GB)

(73) Assignee: Element Six Technologies Limited, Didcot (GB)

( * ) Notice: Subject to any disclaimer, the term of this patent is extended or adjusted under 35 U.S.C. 154(b) by 0 days.

(21) Appl. No.: 17/597,392

(22) PCT Filed: Mar. 26, 2020

(86) PCT No.: PCT/EP2020/058561
§ 371 (c)(1),
(2) Date: Jan. 4, 2022

(87) PCT Pub. No.: WO2020/201016
PCT Pub. Date: Oct. 8, 2020

(65) Prior Publication Data
US 2022/0290297 A1    Sep. 15, 2022

(30) Foreign Application Priority Data
Mar. 29, 2019 (GB) ...................... 1904434

(51) Int. Cl.
C23C 16/27    (2006.01)
C23C 16/01    (2006.01)

(52) U.S. Cl.
CPC ............ C23C 16/278 (2013.01); C23C 16/01 (2013.01); C23C 16/274 (2013.01)

(58) Field of Classification Search
None
See application file for complete search history.

(56) References Cited

U.S. PATENT DOCUMENTS

| | | | |
|---|---|---|---|
| 5,124,179 A | 6/1992 | Garg et al. | |
| 5,648,148 A | 7/1997 | Simpson | |

(Continued)

FOREIGN PATENT DOCUMENTS

| | | | |
|---|---|---|---|
| EP | 0584833 A1 | 3/1994 | |
| JP | 0920589 A1 * | 1/1997 | |

(Continued)

OTHER PUBLICATIONS

Great Britain Patent Application No. 1904434.6, Combined Search and Examination Report under Section 17 and 18 (3), dated Jul. 10, 2019, 7 pages.

(Continued)

*Primary Examiner* — David P Turocy
(74) *Attorney, Agent, or Firm* — Kilpatrick Townsend & Stockton LLP

(57) ABSTRACT

A method of fabricating a polycrystalline CVD synthetic diamond wafer is disclosed. A first polycrystalline CVD synthetic diamond wafer is grown using a CVD process to a first thickness on a substrate. A second smaller wafer is cut from the polycrystalline CVD synthetic diamond wafer. The second smaller wafer is located on a carrier, and further polycrystalline CVD synthetic diamond material is grown on the second smaller wafer to a second thickness to give a polycrystalline CVD synthetic diamond material having a total thickness of the combined first and second thicknesses.

10 Claims, 6 Drawing Sheets

(56) References Cited

U.S. PATENT DOCUMENTS

| | | | |
|---|---|---|---|
| 9,478,938 B2 * | 10/2016 | Williams | C23C 16/511 |
| 2006/0266279 A1 * | 11/2006 | Mokuno | C30B 7/005 |
| | | | 117/903 |
| 2012/0056199 A1 * | 3/2012 | Rosiwal | C04B 37/028 |
| | | | 257/77 |
| 2017/0352538 A1 | 12/2017 | Kim et al. | |

FOREIGN PATENT DOCUMENTS

| | | | |
|---|---|---|---|
| JP | 2014503458 A * | 2/2014 | |
| WO | 2013087702 A2 | 6/2013 | |
| WO | 2014026930 A1 | 2/2014 | |
| WO | WO-2014105085 A1 * | 7/2014 | C30B 25/04 |
| WO | WO-2017050620 A1 * | 3/2017 | C01B 32/25 |

OTHER PUBLICATIONS

Great Britain Patent Application No. 2004394.9, Combined Search and Examination Report under Section 17 and 18 (3), dated Aug. 18, 2020, 6 pages.

International Application No. PCT/EP2020/058561, Search report/Written Opinion, dated Jul. 7, 2020, 14 pages.

* cited by examiner

POLYCRYSTALLINE SYNTHETIC DIAMOND MATERIAL

FIELD

The present invention relates to the fabrication of polycrystalline chemical vapour deposition (CVD) synthetic diamond material, and methods for making such material.

BACKGROUND

Chemical vapour deposition (CVD) processes for synthesis of diamond material are well-known in the art. Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, synthetic diamond material can be deposited.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible plasma reactors for synthetic diamond film growth using a CVD process are known in the art, including microwave plasma CVD reactors, hot filament reactors, plasma jet reactors, and DC cathode arc jet reactors. Such reactors have a variety of different designs. Common features include a plasma chamber; a substrate holder disposed in the plasma chamber; a power source for forming the plasma; a gas flow system for feeding process gases into the plasma chamber and removing them therefrom; and a temperature control system for controlling the temperature of a substrate on the substrate holder.

Using microwave plasma reactors such as those disclosed in the prior art it is possible to grow polycrystalline diamond wafers by chemical vapour deposition on a suitable substrate such as a silicon wafer or a carbide forming refractory metal disk. Such polycrystalline CVD diamond wafers are generally visibly opaque in their as-grown form but can be made transparent by polishing opposing faces of the wafers to produce transparent polycrystalline diamond windows for optical applications.

Diamond material is useful as a heat conducting component as it has a high thermal conductivity. For example, a disk laser may comprise a heat spreading substrate on which a thin disk of laser gain material is disposed. The thin disk is also often called an active mirror because it acts as a mirror with laser gain. The heat spreading substrate may be subjected to a coolant for extracting and removing heat therefrom. An output coupler is positioned opposite the active mirror to form an optical cavity. The active mirror is pumped with, for example, a diode laser and high powered laser light is emitted through the output coupler. It is known to use a polycrystalline CVD synthetic diamond wafer as a heat spreading substrate for mounting the active mirror of a disk laser. Diamond material has been found to be useful in such an application because of its extremely high thermal conductivity. Furthermore, diamond material has a very low thermal expansion coefficient such that thermal distortion is low.

The thermal performance of a polycrystalline CVD synthetic diamond sample is dependent on the physical dimensions of the sample (diameter and thickness) and the 'quality' of the diamond material forming the sample. For example, a thick, large area sample will tend to have better heat spreading functionality than a thin, small area sample. Furthermore, it is known that thermal conductivity is affected by grain size, impurities and/or defects such as non-diamond carbon, which are incorporated into the diamond material during growth. In addition, material quality is intimately linked with wafer geometry and growth rate. For example, growing samples to increased thickness tends to increase the rate at which impurities and/or defects are incorporated into a polycrystalline CVD synthetic diamond wafer. Furthermore, growing samples to increased diameter tends to increase the rate at which impurities and/or defects are incorporated into a polycrystalline CVD synthetic diamond sample, particularly at a periphery of the sample. Further still, growing samples at increased growth rate tends to increase the rate at which impurities and/or defects are incorporated into a polycrystalline CVD synthetic diamond sample.

For reasons of rigidity, it is desirable in some applications for the stiffness of the CVD synthetic diamond to be sufficient to resist flexure during use, for example, when a high power laser beam is passed through the diamond. One way to increase stiffness is to increase the thickness. However, it is very difficult to grow wafers of thickness greater than around 2 mm because growing wafers to increased thickness, diameter, and/or growth rate can also lead to problems of wafer cracking during the synthesis process.

One solution to providing thicker diamond wafers is to join two wafers together, for example by brazing. However, this leads to an interface between the wafers that can introduce non-uniform regions of uniform low thermal conductivity, a point where transmission of light may be affected and a mechanically weaker point, and so this solution is not desirable.

Furthermore, growth times can be measured in periods of weeks and an event such as a power failure during a growth run can make the resultant polycrystalline diamond material unusable. If a problem at the start of the run (such as cracking or contamination) occurs, this may not be noticed. It could be several weeks before the run is finished and so the run may not provide any usable polycrystalline diamond material.

SUMMARY

In light of the above, it is an aim of certain embodiments of the present invention to provide a robust method of growing polycrystalline CVD diamond that is less susceptible to run failures.

According to a first aspect, there is provided a method of fabricating a polycrystalline CVD synthetic diamond wafer. The method comprises:

locating a substrate in a first CVD reactor;

introducing process gases into the first CVD reactor, wherein the process gases within the CVD reactor comprises a carbon containing gas and hydrogen, and using the process gases to form a plasma;

growing a first polycrystalline CVD synthetic diamond wafer to a first thickness on the substrate;

removing the first polycrystalline CVD synthetic diamond wafer from the first CVD reactor;

removing the first polycrystalline CVD synthetic diamond wafer from the substrate;

cutting at least one second smaller wafer from the polycrystalline CVD synthetic diamond wafer;

locating the at least one second smaller wafer on a carrier;

locating the carrier and second smaller wafer in a second CVD reactor;

introducing process gases into the second CVD reactor, wherein the process gas within the second CVD reactor comprises nitrogen, a carbon containing gas, and hydrogen, and using the process gases to form a plasma; and growing further polycrystalline CVD synthetic diamond material on the second smaller wafer to a give a second thickness to give a polycrystalline CVD synthetic diamond material having a total thickness of the combined first and second thicknesses.

An advantage of growing on a second, smaller wafer is that a smaller wafer has a lower temperature difference during growth across the surface of the wafer. Furthermore, the reduced ratio of the largest linear dimension of the smaller wafer to thickness means that the smaller wafer is stiffer and less likely to flex and delaminate during the growth of further polycrystalline diamond.

As an option, the second CVD reactor is the first CVD reactor.

As an option, the second smaller wafer is cut from at least a central area of the first polycrystalline CVD synthetic diamond wafer, wherein the central area is at least 70% of a total area of the first polycrystalline CVD synthetic diamond wafer, and wherein the first polycrystalline CVD synthetic diamond wafer is substantially crack free over at least the central area thereof such that the central area has no cracks which intersect both external major faces of the first polycrystalline CVD synthetic diamond wafer and extend greater than 2 mm in length.

The substrate optionally has a largest linear dimension that lies in a range 60 mm to 200 mm, 80 mm to 150 mm, 90 mm to 110 mm, or 95 mm to 105 mm.

As an option, the carrier comprises a polycrystalline CVD synthetic diamond surface.

The second smaller wafer is optionally located on the carrier by any of brazing, soldering, or mechanically affixing.

The temperature difference between the edge and the centre point on the substrate is optionally no more than any of 60° C., 40° C., 20° C., or 10° C.

The method optionally further comprises cutting a plurality of second smaller wafers from the polycrystalline CVD synthetic diamond wafer and affixing at least one of the plurality of second smaller wafers to the carrier.

As an option, the first thickness is selected from any of no less than 0.2 mm, no less than 0.5 mm, no less than 1.0 mm, no less than 2.0 mm, no less than 3.0 mm and no less than 4.0 mm.

As an option, the second total thickness is selected from any of no less than 0.2 mm, no less than 0.5 mm, no less than 1.0 mm, no less than 2.0 mm, no less than 3.0 mm and no less than 4.0 mm.

The substrate is optionally formed from a carbide-forming metal.

The method optionally further comprises processing a surface of the at least one second smaller wafer prior to growth of further polycrystalline diamond on the second smaller wafer.

As an option, the surface that is processed is the surface that was initially adjacent to the substrate. This is advantageous because the diamond grains located at that surface are smaller than the diamond grains at the opposite surface. Smaller diamond grains are more suitable for the subsequent growth of the further polycrystalline diamond.

The method optionally further comprises growing the first polycrystalline CVD synthetic diamond wafer and growing the further polycrystalline CVD synthetic diamond material using different conditions selected from any of time, power density, pressure and gas composition such that the first polycrystalline CVD synthetic diamond and the further polycrystalline CVD synthetic diamond material have different properties.

As an option, any of the first and CVD reactor and the second CVD reactor is a microwave plasma CVD reactor.

According to a second aspect, there is provided a polycrystalline CVD synthetic diamond material having an average thermal conductivity at room temperature through a thickness of the polycrystalline CVD synthetic diamond material of between 1700 and 2400 $Wm^{-1}K^{-1}$, a total thickness of at least 2.5 mm, and wherein the thickness comprises a first thickness of first polycrystalline diamond material grown using first growth conditions, and a second thickness of second polycrystalline diamond material grown using second growth conditions, the first thickness and the second thickness being separated by a growth event interface.

As an option, the material has two opposing external major faces and the material is substantially crack free such that there are no cracks that intersect both external major faces of the polycrystalline CVD synthetic diamond material.

As an option, the average thermal conductivity at room temperature through the thickness of the polycrystalline CVD synthetic diamond material is selected from any of at least 1750 $Wm^{-1}K^{-1}$, 1800 $Wm^{-1}K^{-1}$, 1850 $Wm^{-1}K^{-1}$, 1900 $Wm^{-1}K^{-1}$, or 1950 $Wm^{-1}K^{-1}$.

As an option, the polycrystalline CVD synthetic diamond material has a largest linear dimension selected from any of at least 10 mm, at least 15 mm, at least 20 mm, at least 25 mm, at least 30 mm, at least 40 mm, at least 50 mm, at least 75 mm and at least 100 mm.

As an option, the total thickness of the polycrystalline CVD synthetic diamond material is selected from any of at least 2.75 mm, 3.0 mm, 3.25 mm, or 3.5 mm.

The growth event interface optionally has a thickness of no more than 5% of the first thickness, no more than 2% of the first thickness and no more than 1% of the first thickness.

The first thickness of first polycrystalline diamond material optionally has a different composition to the second thickness of second polycrystalline diamond material.

The first thickness of first polycrystalline diamond material optionally has a different thickness to the second thickness of second polycrystalline diamond material.

According to a third aspect, there is provided a polycrystalline CVD synthetic diamond material made according to the method described above in the first aspect.

BRIEF DESCRIPTION OF DRAWINGS

Non-limiting embodiments will now be described by way of example and with reference to the accompanying drawings in which.

DETAILED DESCRIPTION

The inventor has realised that higher yields and early identification of failed growth runs can be achieved by growing a polycrystalline CVD diamond wafer to a first thickness, cutting usable parts of this wafer into one or more smaller polycrystalline CVD diamond wafer and then continuing diamond growth on the smaller polycrystalline CVD diamond wafers. In this way, if a problem has occurred at the start of a growth run, it is identified early when the first polycrystalline CVD diamond wafer is processed to form the smaller wafers. Furthermore, if the continued diamond growth on the smaller wafers has a yield of, say, 80%, this is an improvement over the prior art where the entire run would give no usable yield. A further advantage of the method is that diamond can be grown with different properties at different points through the thickness of the final material. A further advantage of the method is that the polycrystalline CVD diamond can be grown at near net-shape, thereby requiring less processing to form a final product.

Figure 1:
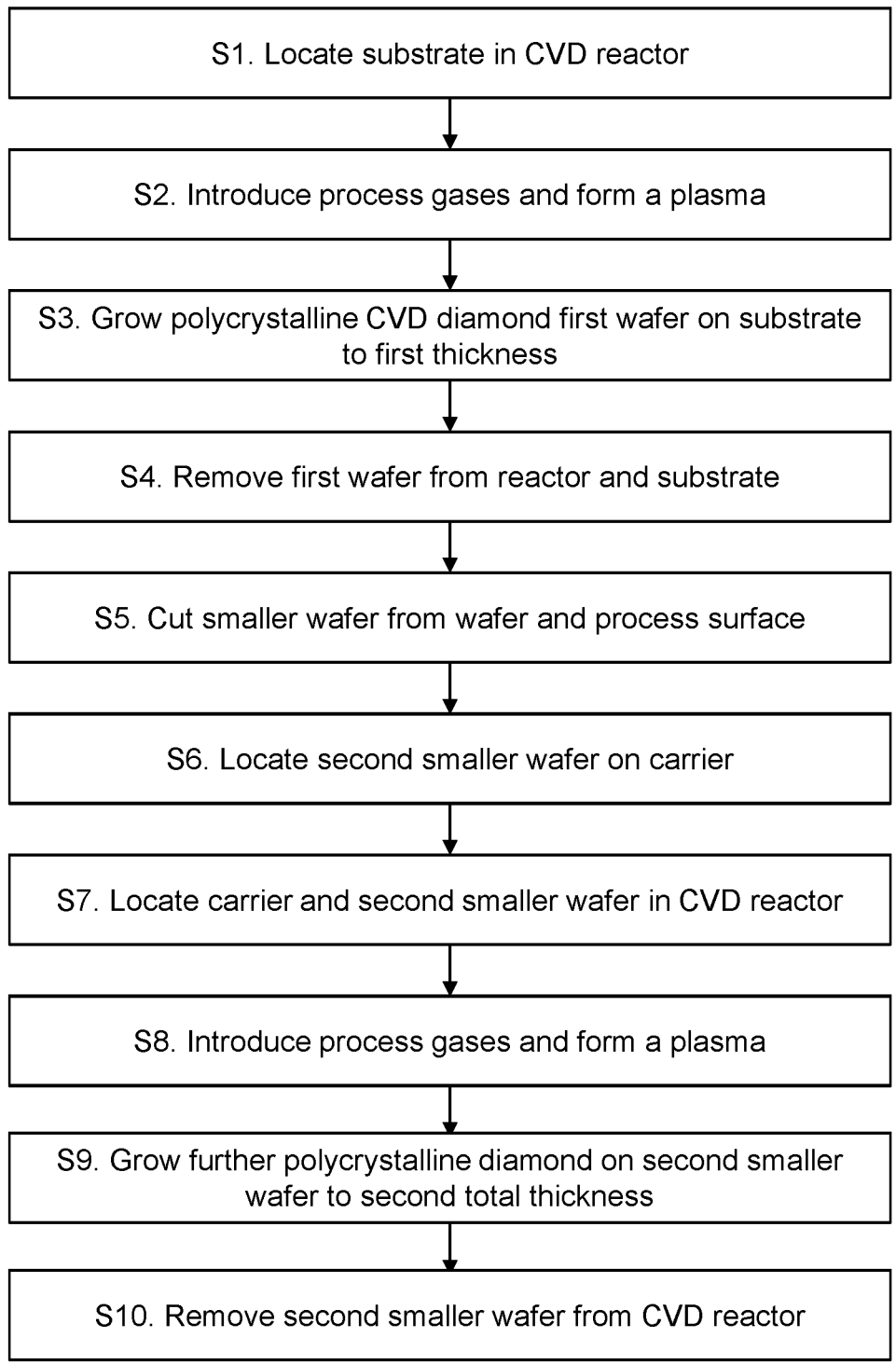
FIG. 1 is a flow diagram showing exemplary steps.

The process is illustrated in the flow diagram of FIG. 1, wherein the following numbering corresponds to that of the flow diagram:

S1. A substrate is located in a first CVD reactor. An example of a suitable CVD reactor is described in WO 2104/026930. Any suitable substrate may be used, such as a refractory carbide-forming metal, a substrate coated with diamond, as well known by the person of skill in the art. The substrate is processed to obtain a low surface roughness. Prior to CVD diamond growth, the refractory metal substrates may be cleaned to ensure all contamination from the processing has been removed and/or seeded to aid nucleation for diamond growth thereon. Typical sizes for the substrate range from 60 mm to 200 mm, 80 mm to 150 mm, 90 mm to 110 mm or 95 mm to 105 mm.

S2. Process gases are introduced, which are ionized to form a plasma close to the substrate. The process gases include hydrogen and a carbon containing gas such as methane. Other gases may also be added if it is required to dope the polycrystalline diamond. Examples of other types of gas include boron-containing gas and nitrogen containing gas.

The plasma may be formed by any suitable method known to the skilled person, such as using any of a microwave plasma CVD reactor, a hot filament reactor, a plasma jet reactor, and a DC cathode arc jet reactors.

While high power density and high pressure conditions have been found to be advantageous for synthesis of certain grades of polycrystalline diamond material at high growth rates, if the power density and pressure are made too high then the growth conditions become less stable and more difficult to control in a uniform manner.

The temperature of the substrate may be controlled, partly by the microwave power and partly by the use of cooling gases flowing adjacent to the substrate. Typically, the temperature difference between the edge and a centre point of the substrate is no more than 60° C., 49° C., 20° C. or 10° C. A low temperature difference is desirable to reduce strain within the substrate and the diamond material grown on the substrate, but it can be difficult to achieve this. As the largest linear dimension of the substrate increases, it becomes harder to control the temperature difference.

S3. A first polycrystalline CVD synthetic diamond wafer is grown to a first thickness on the substrate.

S4. The first polycrystalline CVD synthetic diamond wafer is removed from the first CVD reactor. It may also be removed from the substrate.

Figure 2A:
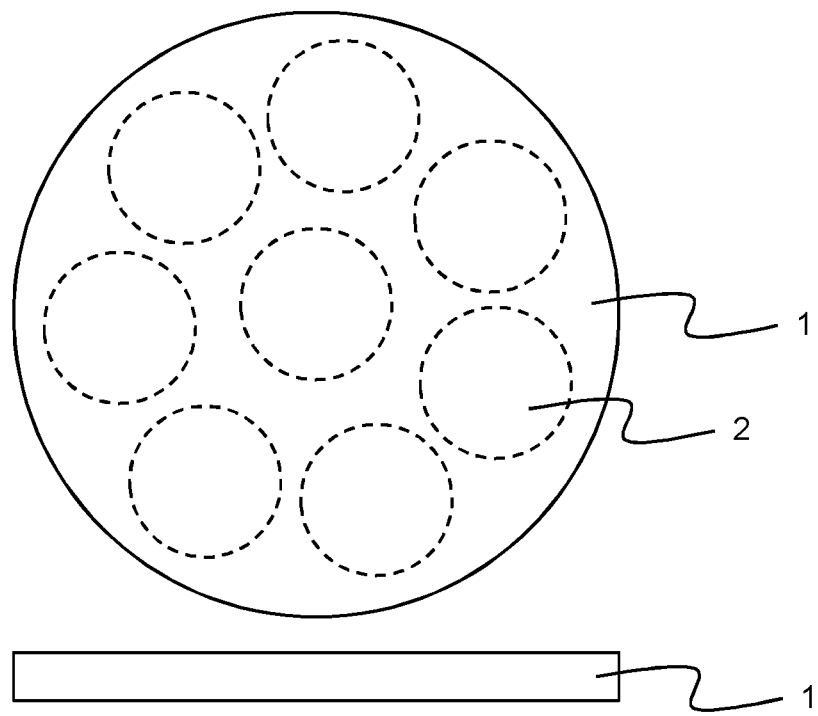
FIG. 2 illustrates schematically in plan view the process of FIG. 1.

S5. As shown in FIG. 2*a*, the polycrystalline CVD synthetic diamond wafer 1 is processed to cut a second, smaller wafer 2 from the polycrystalline CVD synthetic diamond wafer. FIG. 2*a* shows a plan view and a side elevation view of the polycrystalline CVD synthetic diamond wafer 1. Any suitable cutting technique may be used, such as laser cutting, Electrical Discharge Machining (EDM) if the diamond is of a suitably electrically conducting composition), mechanical cutting and so on. The second smaller wafer 2 may then also be cleaned to remove graphite and other contaminants, and may be further processed to give a surface with a required roughness, flatness and uniform (or controlled) thickness. As shown in FIG. 2*a*, a plurality of second smaller wafers 2 may be cut from the polycrystalline CVD synthetic diamond wafer 1. Note that not all of the polycrystalline CVD synthetic diamond wafer 1 may be of sufficient quality for further diamond growth. Cracks, impurities and inclusions may make sections of the polycrystalline CVD synthetic diamond wafer 1 unsuitable. Typically, such regions will be towards the circumference of the polycrystalline CVD synthetic diamond wafer and only a central portion of the polycrystalline CVD synthetic diamond wafer 1 may be usable.

Figure 2B:
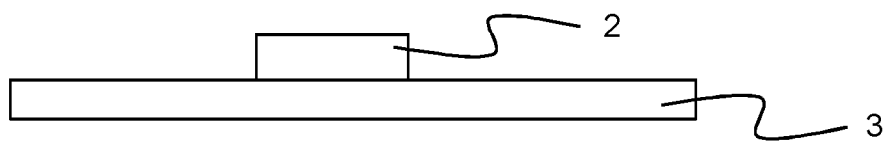
Figure 2C:
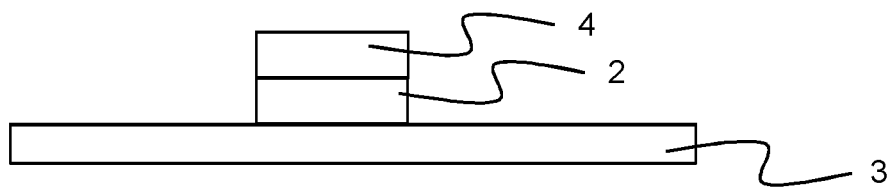

S6. As shown in FIG. 2*b*, the second smaller wafer 2 is located on a carrier 3 by any suitable means. Examples of such means include brazing, soldering and mechanically affixing. In most cases, it is important to have a uniform thermal contact between the second smaller wafer 2 and the carrier 3 to ensure that the temperature and temperature variations across the surface of the second smaller wafer 2 can be controlled, and that hot-spots do not appear between the second smaller wafer 2 and the carrier 3. Carriers may include other smaller wafers, carbide-forming metals, carbide-forming metals with a coating of polycrystalline diamond or other suitable materials as known to the skilled person. Note that a plurality of second smaller wafers 2 may be located on the carrier.

S7. The carrier 3 and the second smaller wafer 2 (or wafers) are located in a second CVD reactor. The second CVD reactor may be the same CVD reactor as used to grow the first polycrystalline CVD synthetic diamond wafer, or it may be a different CVD reactor.

S8. Process gases are introduced into the reactor and ionized to form a plasma close to the substrate. The process gases include a carbon containing gas such as methane, hydrogen, and the process gas forms a plasma. Other gases may also be added if it is required to dope the polycrystalline diamond. Examples of other types of gas include boron-containing gas and nitrogen containing gas. Growth conditions are typically similar to those described above in S2 of the flow diagram. However, note that the growth conditions may differ significantly to give diamond with different properties. For example, it may be desirable to have a diamond material that has a first layer of diamond that has a high abrasion resistance, and a second layer that has a high thermal conductivity.

S9. Further polycrystalline CVD synthetic diamond material 4 is grown on the second smaller wafer 2 to a give a second total thickness of polycrystalline CVD synthetic diamond material.

S10. The second smaller wafer 2 is removed from the second CVD reactor and if necessary removed from the carrier for further processing to form a finished product such as a heat spreader or optical window. Alternatively, the second smaller wafer may be further processed and steps S6 to S9 repeated to give a diamond material with three or more layers.

When examining the resultant diamond material, a growth event interface is apparent between the layer of diamond grown in S2 and S3, and the layer of diamond grown in steps S8 and S9. This interface is apparent even where the growth conditions are identical. This may be observed as a change in luminescence or texture. Even if the growth conditions are identical in steps S2 and S8, the ramp up to the growth conditions will leave a visible growth interface.

In an exemplary process, a substrate in the form of a carbide-forming metal disc with a diameter of 100 mm was polished to give a surface roughness $R_a$ of less than 1 µm. The diamond synthesis process used a microwave plasma CVD reactor with a power density of 3.5 W mm$^{-2}$, a pressure of around 200 torr and process gases including hydrogen and a carbon containing gas. A first polycrystalline CVD diamond wafer was produced with a thickness of around 2.5 mm.

The first polycrystalline CVD diamond wafer was laser cut into a plurality of second smaller wafers, each having a diameter of 25 mm. Each second smaller wafer was cleaned by boiling in acid to remove graphite and other contaminants.

A second tungsten disc was provided that had been coated with polycrystalline CVD synthetic diamond. The second smaller wafer was attached to the coated surface of the tungsten disc.

The second tungsten disc with the second smaller wafer was returned to the CVD reactor and a growth run was carried out to grow a second layer to a thickness of 0.8 mm, making a total thickness of 3.3 mm.

Figure 3:
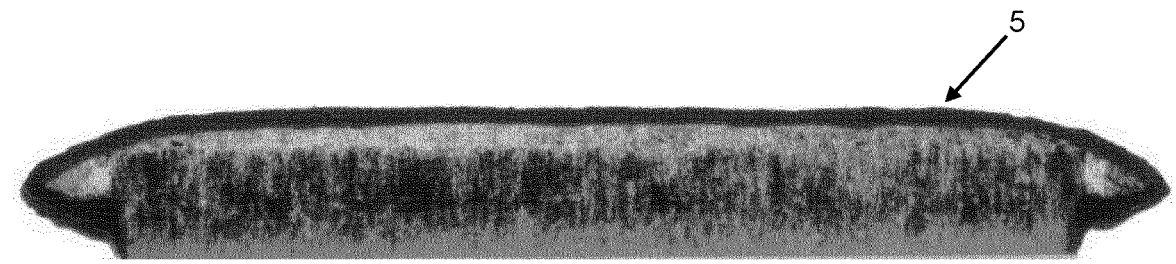
FIG. 3 is a cross-section micrograph showing polycrystalline CVD synthetic diamond material grown according to the method of FIG. 1.
Figure 4:
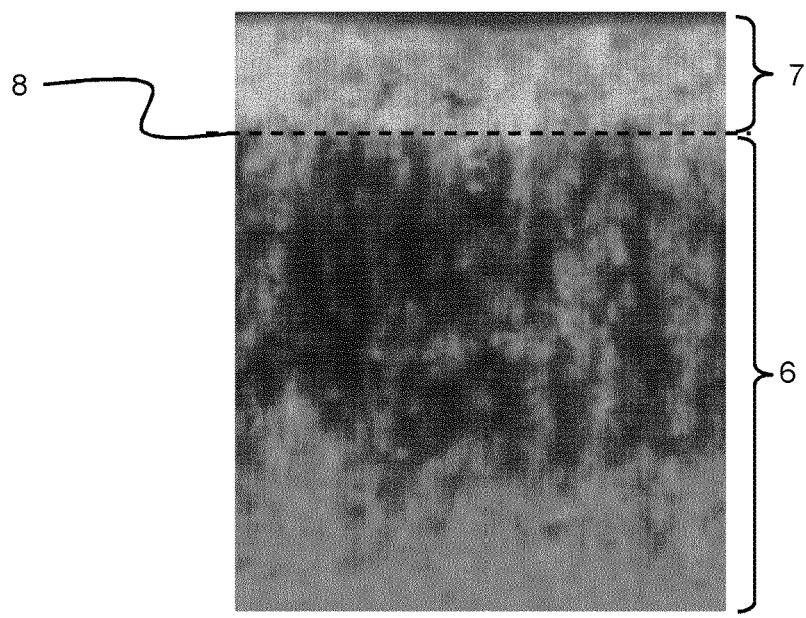
FIG. 4 is a cropped and higher magnification image of the polycrystalline CVD synthetic diamond of FIG. 2.

FIG. 3 is a cross-section micrograph showing the final polycrystalline CVD synthetic diamond material 5. FIG. 4 is a cropped and higher magnification image of the polycrystalline CVD synthetic diamond 1 of FIG. 3.

The first layer 6 of diamond material included some microfeatures and other defects. Microfeatures are described in WO 2013/087702. Optical microscopy of polycrystalline diamond samples in general reveals the presence of microscopic crack-like features, termed "microfeatures" formed during synthesis within individual grains, which are most probably a result of inter-grain stress. These microfeatures have diverse shapes, however typically have a radius of approximately 50-100 µm, and have been shown to have a negative impact upon certain physical properties of the diamond material. Microfeatures can be inspected under a microscope at a magnification of around ×50.

The second layer 7 of further diamond material had fewer microfeatures than the first layer 2. The interface 8 between the first layer 6 and the second layer 7 was found to be substantially free of voids and no delamination occurred between the first layer 6 and second layer 7, even when the surface of the second layer 3 was mechanically processed.

Figure 5:
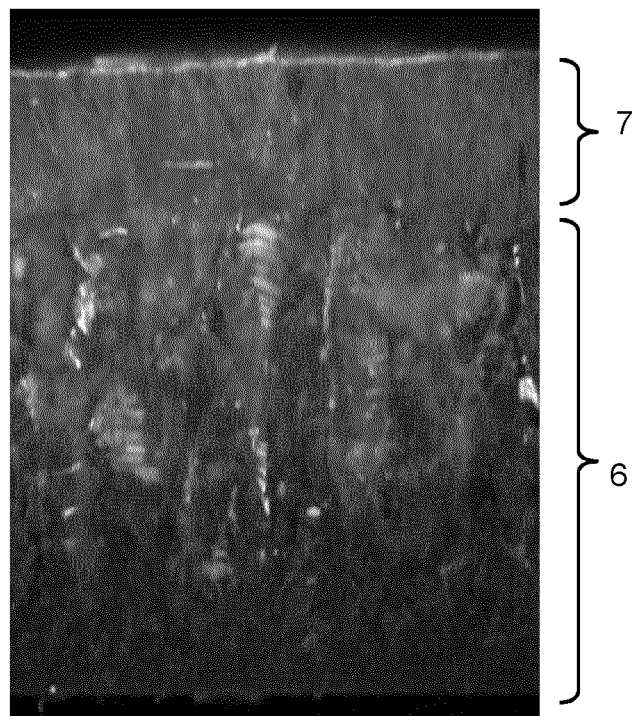
FIG. 5 is a Diamondview™ image of the cross-section of FIG. 3.

FIG. 5 is a Diamondview™ image of the cross-section of FIG. 4, where the original material has a characteristic blue and red colouration. Diamondview reveals surface fluorescence by illuminating diamond with short wave ultra-violet light. Red colouration arises from nitrogen-vacancy centres within the grains of the polycrystalline diamond. Blue colouration arises from dislocations and grain boundaries. Two layers are observed; the first layer 6 contains some red colouration and the second layer 7 contains very little red colouration.

Figure 6:
FIG. 6 is a differential interference contrast (DIC) image of the polished growth surface.

FIG. 6 is a differential interference contrast (DIC) image of the polished growth surface of the second layer 7. This shows a surface as expected for a high quality material with few flaws, in that there are no discernible features other than some grain exposed and no voids.

Figure 7A:
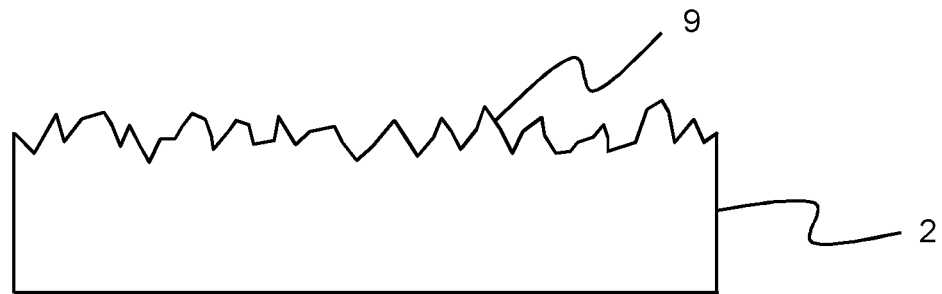
FIG. 7 illustrates schematically in a side elevation view (not to scale) the variation in thickness of an as grown polycrystalline CVD diamond material and the effect of processing the surface of the polycrystalline CVD diamond material.

When polycrystalline CVD diamond is growth, the variation in the thickness across the surface of the diamond is typically around 10% of the thickness. FIG. 7a illustrates schematically a small wafer 2 in side elevation view. The surface 9 of the small wafer is rough and the thickness varies by around 10% of the average thickness.

Figure 7B:
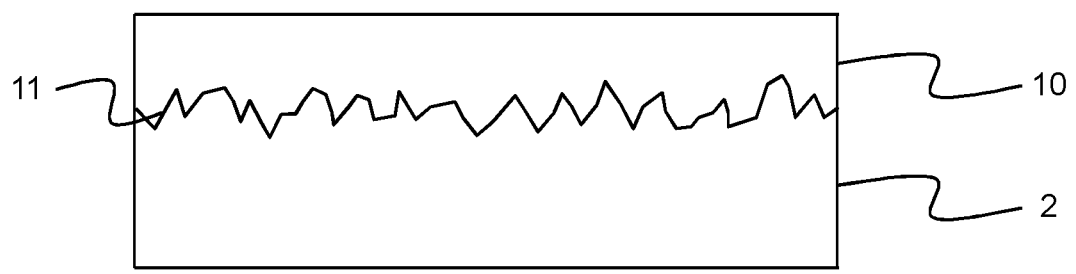

As shown in FIG. 7b, once further diamond 10 is grown on the smaller wafer 2, a growth even interface 11 can be seen between the smaller wafer 2 and the further diamond 10. The growth event interface typically has a thickness of around 10% of the average thickness of the smaller wafer 2. A growth event interface will also be observed if instead of following steps S1 to S10, the growth conditions are simply changed between growing the two layers.

Figure 7C:
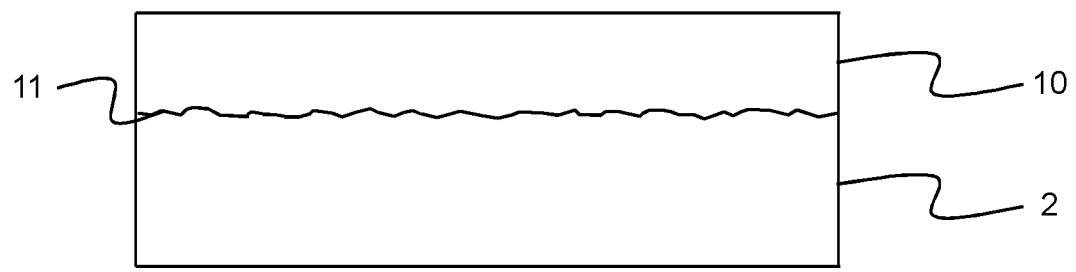

If the surface of the second wafer is processed to reduce the surface roughness on the growth surface and to reduce variations in the thickness of the second wafer 2, a much thinner growth event interface can be observed, as shown in FIG. 7c. This thickness may be no more than 5% of the first thickness, no more than 2% of the first thickness or no more than 1% of the first thickness. Such processing is well known to a person of skill in the art, and may include lapping, grinding, polishing and other well-known techniques.

Note that this processing may be applied to the surface of each smaller wafer 2, or may be applied to the surface of the polycrystalline CVD synthetic diamond wafer 1 before it is cut into smaller wafers 2.

In a further embodiment, the surface of the smaller wafer 2 that is processed and forms the growth surface for the further diamond material 10 is the surface that was initially adjacent to the substrate in the initial growth stage. As CVD polycrystalline diamond is grown, the grains coarsen and so grains adjacent to the substrate at the start of growth are typically smaller than grains at the opposite surface to the surface adjacent to the substrate. This is illustrated in FIG. 8.

Figure 8A:
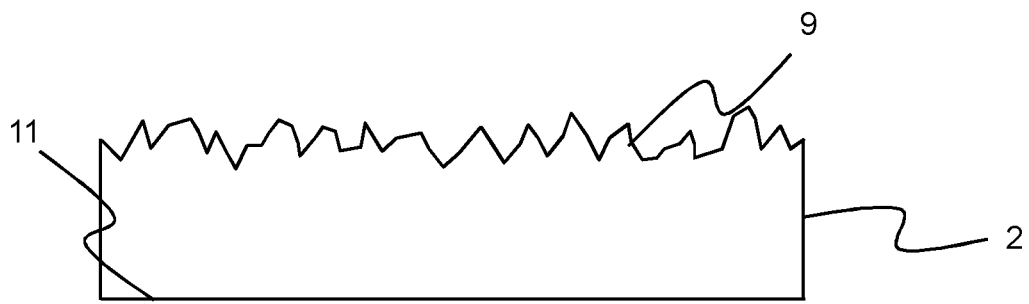
FIG. 8 illustrates schematically in a side elevation view (not to scale) the effect of using the surface of the wafer adjacent to the substrate as a new growth surface.
Figure 8B:
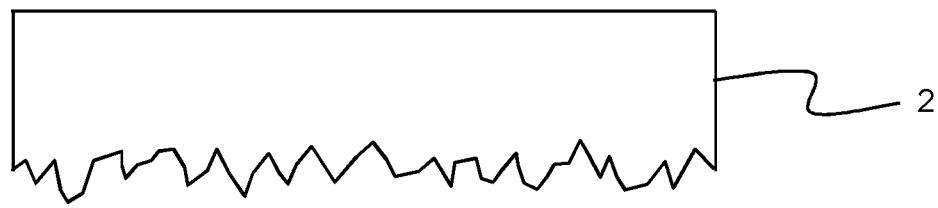
Figure 8C:
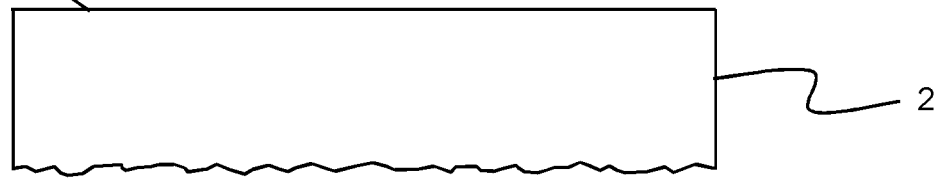
Figure 8D:

FIG. 8a shows a smaller wafer 2 with a rough surface 9 and an opposite surface 11 that was originally adjacent to substrate. Note that the opposite surface will also have surface roughness (not shown) that will need to be processed. The smaller wafer 2 is turned over and both of the major surfaces 9, 11 are processed to give a low surface roughness and a uniform thickness (shown in FIGS. 8b and 8c).

The average grain size at the rough surface 9 is larger than the average grain size at the opposite surface. As a smaller grain size gives rise to a more uniform polycrystalline diamond material, the opposite surface 11 is used as a surface on which to grow the further polycrystalline CVD diamond 10.

While this invention has been particularly shown and described with reference to preferred embodiments, it will be understood to those skilled in the art that various changes in form and detail may be made without departing from the scope of the invention as defined by the appendant claims.

The invention claimed is:

1. A method of fabricating a polycrystalline CVD synthetic diamond wafer, the method comprising:
    locating a substrate in a first CVD reactor;
    introducing process gases into the first CVD reactor, wherein the process gases within the CVD reactor comprises a carbon containing gas and hydrogen, and using the process gases to form a plasma;
    growing a first polycrystalline CVD synthetic diamond wafer to a first thickness on the substrate;
    removing the first polycrystalline CVD synthetic diamond wafer from the first CVD reactor;
    removing the first polycrystalline CVD synthetic diamond wafer from the substrate;
    cutting at least one second smaller wafer from the polycrystalline CVD synthetic diamond wafer;
    locating the at least one second smaller wafer on a carrier;
    locating the carrier and second smaller wafer in a second CVD reactor;
    introducing process gases into the second CVD reactor, wherein the process gas within the second CVD reactor comprises nitrogen, a carbon containing gas, and hydrogen, and using the process gases to form a plasma; and
    growing further polycrystalline CVD synthetic diamond material on the second smaller wafer to a second thickness to give a polycrystalline CVD synthetic diamond material having a total thickness of the combined first and second thicknesses.

2. The method according to claim 1, wherein the second CVD reactor is the first CVD reactor.

3. The method according to claim 1 wherein the second smaller wafer is cut from at least a central area of the first polycrystalline CVD synthetic diamond wafer, wherein the central area is at least 70% of a total area of the first polycrystalline CVD synthetic diamond wafer, and wherein the first polycrystalline CVD synthetic diamond wafer is substantially crack free over at least the central area thereof such that the central area has no cracks which intersect both external major faces of the first polycrystalline CVD synthetic diamond wafer and extend greater than 2 mm in length.

4. The method according to claim 1, wherein the carrier comprises a polycrystalline CVD synthetic diamond surface.

5. The method according to claim 1, further comprising cutting a plurality of second smaller wafers from the polycrystalline CVD synthetic diamond wafer and affixing at least one of the plurality of second smaller wafers to the carrier.

6. The method according to claim 1, wherein the substrate is a carbide-forming metal.

7. The method according to claim 1, further comprising processing a surface of the at least one second smaller wafer prior to growth of further polycrystalline diamond on the second smaller wafer.

8. The method according to claim 7, wherein the surface that is processed is the surface that was initially adjacent to the substrate.

9. The method according to claim 1, further comprising growing the first polycrystalline CVD synthetic diamond wafer and growing the further polycrystalline CVD synthetic diamond material using different conditions selected from any of time, power density, pressure and gas composition such that the first polycrystalline CVD synthetic diamond and the further polycrystalline CVD synthetic diamond material have different properties.

10. The method according to claim 1, wherein any of the first and CVD reactor and the second CVD reactor is a microwave plasma CVD reactor.

* * * * *